United States Patent
Nakagawa (10) Patent No.: US 10,459,015 B2
(45) Date of Patent: Oct. 29, 2019

(54) VEHICLE INFORMATION TERMINAL AND POWER GENERATION INFORMATION COLLECTION SYSTEM

(71) Applicant: TOYOTA JIDOSHA KABUSHIKI KAISHA, Toyota-shi, Aichi-ken (JP)

(72) Inventor: Masashi Nakagawa, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 15/301,752

(22) PCT Filed: Mar. 31, 2015

(86) PCT No.: PCT/JP2015/001858
§ 371 (c)(1),
(2) Date: Oct. 4, 2016

(87) PCT Pub. No.: WO2015/155958
PCT Pub. Date: Oct. 15, 2015

(65) Prior Publication Data
US 2017/0038417 A1 Feb. 9, 2017

(30) Foreign Application Priority Data
Apr. 11, 2014 (JP) .................. 2014-081647

(51) Int. Cl.
*G01R 21/133* (2006.01)
*B60L 8/00* (2006.01)
(Continued)

(52) U.S. Cl.
CPC .......... *G01R 21/1331* (2013.01); *B60L 8/003* (2013.01); *G07C 5/008* (2013.01);
(Continued)

(58) Field of Classification Search
CPC .. G01R 21/1331; G01R 22/063; G07C 5/008; Y02T 10/7283; Y02T 10/7083;
(Continued)

(56) References Cited

U.S. PATENT DOCUMENTS 8,971,936 B2 * 3/2015 Derchak .............. A61B 5/0002
455/500
9,576,474 B2 * 2/2017 Macdonald ............ G08C 17/02
(Continued)

FOREIGN PATENT DOCUMENTS

JP 2004-287724 10/2004
JP 2008-97345 4/2008
(Continued)

*Primary Examiner* — Son T Le
*Assistant Examiner* — Dustin R Dickinson
(74) *Attorney, Agent, or Firm* — Finnegan, Henderson, Farabow, Garrett & Dunner, LLP (57) ABSTRACT

A vehicle information terminal is used in a vehicle equipped with an energy converter for converting an external energy to an electric power. The vehicle information terminal includes a management unit that generates a power generation information associated with a vehicle position and a power generation amount of the energy converter. The management unit is operative to transmit the power generation information to an external device. A transmission condition of the power generation information of the management unit is set so that transmission frequency of the power generation information during travel of the vehicle is higher than transmission frequency of the power generation information during stop of the vehicle.

5 Claims, 6 Drawing Sheets (51) Int. Cl.
  *G07C 5/00* (2006.01)
  *H04L 29/08* (2006.01)
(52) U.S. Cl.
  CPC ........... *H04L 67/12* (2013.01); *B60L 2240/62* (2013.01); *B60L 2240/665* (2013.01); *B60L 2240/70* (2013.01); *Y02T 10/7083* (2013.01); *Y02T 10/7291* (2013.01); *Y02T 90/16* (2013.01); *Y02T 90/162* (2013.01)
(58) Field of Classification Search
  CPC ... Y02T 10/7291; Y02T 90/16; Y02T 90/162; B60L 2240/665; B60L 2240/62; H04L 67/12
  See application file for complete search history.

(56) References Cited

U.S. PATENT DOCUMENTS

| | | | | |
|---|---|---|---|---|
| 10,023,062 | B2* | 7/2018 | Kang | B60L 53/63 |
| 2007/0279283 | A1* | 12/2007 | Flick | B60R 25/04 |
| | | | | 342/357.31 |
| 2008/0091339 | A1 | 4/2008 | Nagase et al. | |
| 2010/0256862 | A1* | 10/2010 | Verhardt | E21C 47/00 |
| | | | | 701/31.4 |
| 2010/0264906 | A1* | 10/2010 | Shamir | G01R 15/186 |
| | | | | 324/127 |
| 2011/0133038 | A1* | 6/2011 | Kiss, Jr. | B61L 29/24 |
| | | | | 246/126 |
| 2012/0053742 | A1* | 3/2012 | Tsuda | B60L 11/1842 |
| | | | | 700/291 |
| 2013/0121176 | A1* | 5/2013 | Addepalli | H04L 67/12 |
| | | | | 370/252 |
| 2013/0332056 | A1 | 12/2013 | Huang et al. | |
| 2014/0024313 | A1* | 1/2014 | Campbell | H04B 1/3822 |
| | | | | 455/41.2 |
| 2014/0164555 | A1* | 6/2014 | Followell | H04L 67/12 |
| | | | | 709/217 |

FOREIGN PATENT DOCUMENTS

| | | |
|---|---|---|
| JP | 2011-163987 | 8/2011 |
| JP | 2013-19797 | 1/2013 |
| JP | 2013-109625 | 6/2013 |

* cited by examiner

VEHICLE INFORMATION TERMINAL AND POWER GENERATION INFORMATION COLLECTION SYSTEM

CROSS-REFERENCE TO RELATED APPLICATIONS

This application is a national phase application of International Application No. PCT/JP2015/001858, filed Mar. 31, 2015, and claims the priority of Japanese Application No. 2014-081647, filed Apr. 11, 2014, the content of both of which is incorporated herein by reference.

TECHNICAL FIELD

The present invention relates to a vehicle information terminal and a power generation information collection system for handling information on an energy conversion device that converts an external energy to electrical power.

BACKGROUND ART

Recently, a vehicle equipped with a solar power generating device on a roof or the like has been proposed. Driving environment of the vehicle of this type is desirably efficiency. For example, Patent Document 1 proposes a system for providing power generation information of the vehicle equipped with a solar power generating device to the user. The system includes a power generation information request device used in the vehicle equipped with the solar power generating device. The power generation information request device correlates power generation amount of the solar power generating device with position and time of the vehicle to generate probe information, and transmits the probe information. A center collects the probe information transmitted from an unspecified number of the power generation information request device. The center generates information indicating a route and time zone efficient for power generation, information indicating a position in the parking lot efficient for power generation, and the like based on the collected probe information and weather information obtained from the external service unit. The center provides this information to the power generation information request device.

CITATION LIST

Patent Literature

[PTL 1]
Japanese Laid-Open Patent Publication No. 2013-19797

SUMMARY OF INVENTION

Technical Problem

In order to provide information as described above to the user, it is necessary for an external device such as the center to efficiently collect the probe information associated with position and power generation amount. When collecting the probe information, the probe information may be frequently transmitted from the vehicle device even when the driving environment of the vehicle does not change greatly. This increases the frequency of communication more than necessary and increases the load on the vehicle device and the power consumption. Conversely, when the frequency of transmission of the probe information is too low, the amount of data of the probe information collected on the external device decreases so that generating the information to be provided to the user as described above would be difficult.

It is an objective of the present invention to provide a vehicle information terminal and a power generation information collection system capable of efficiently collecting information from a vehicle including an energy conversion device.

Solution to Problem

One aspect of the present invention is a vehicle information terminal used in a vehicle equipped with an energy converter for converting an external energy to an electric power. The vehicle information terminal includes a management unit that generates a power generation information associated with a vehicle position and a power generation amount of the energy converter. The management unit is operative to transmit the power generation information to an external device. A transmission condition of the power generation information of the management unit is set so that transmission frequency of the power generation information during travel of the vehicle is higher than transmission frequency of the power generation information during stop of the vehicle.

A further aspect of the present invention is a power generation information collection system includes a vehicle information terminal and an external device. The vehicle information terminal is used in a vehicle equipped with anr energy converter for converting an external energy to an electric power. The external device is provided for collecting a power generation information transmitted from the vehicle information terminal. The vehicle information terminal includes a management unit that generates a power generation information associated with a vehicle position and a power generation amount of the energy converter. The management unit is operative to transmit the power generation information to the external device. The transmission condition of the power generation information of the management unit is set so that transmission frequency of the power generation information during travel of the vehicle is higher than transmission frequency of the power generation information during stop of the vehicle. The external device includes a storage unit that stores the power generation information transmitted from the vehicle information terminal.

DESCRIPTION OF EMBODIMENTS (First Embodiment)

Hereinafter, a first embodiment of a vehicle information terminal and a power generation information collection system will be described with reference to FIGS. 1 to 5.

Figure 1:
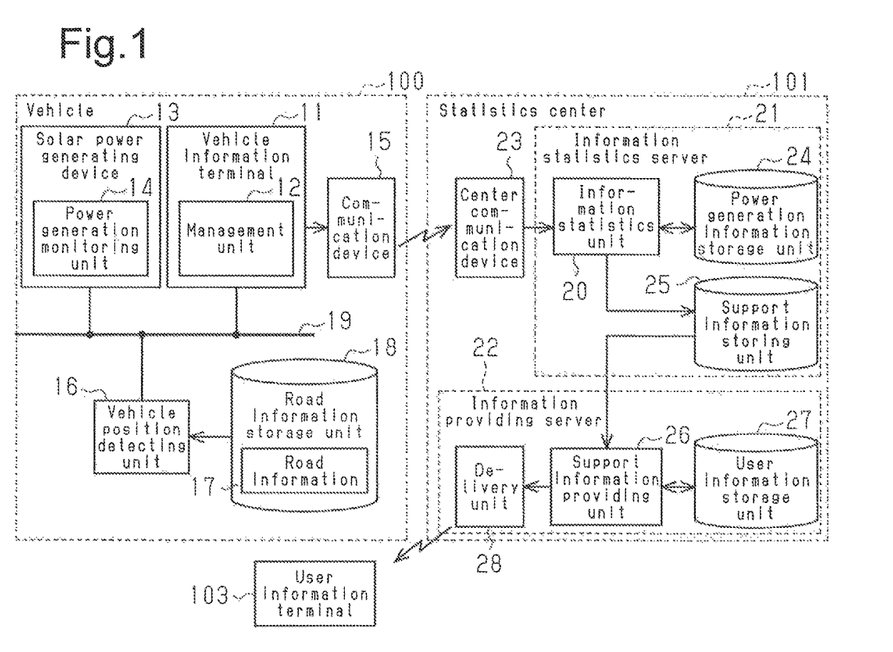
FIG. 1 is a block diagram showing a schematic configuration of a vehicle information terminal and a power generation information collection system according to a first embodiment of the present invention.

As shown in FIG. 1, the power generation information collection system includes a vehicle information terminal 11 mounted on a vehicle 100 to transmit power generation information. The power generation information collection system further includes an information statistics unit 20 provided in a statistics center 101 serving as an external device to collect the power generation information uploaded from the vehicle information terminal 11.

The vehicle 100 includes a solar power generating device 13 serving as an energy conversion device. The solar power generating device 13 is mounted on a roof of the vehicle 100, and configured to photoelectrically convert sunlight incident on a light receiving unit to obtain electric power and supply the electric power to an electric power system of the vehicle 100. The solar power generating device 13 includes a main body (not shown), which performs photoelectric conversion, and a power generation monitoring unit 14, which monitors an output from the main body and detects an amount of power generated per unit time. The solar power generating device 13 is controlled by the power generation monitoring unit 14 to perform the photoelectric conversion during travel of the vehicle 100 as well as during a stop of the vehicle 100 and is capable of supplying electric power to the power system of the vehicle 100. Here, the word "stop" is referred to as a state during which the vehicle 100 does not move. In particular, in this embodiment, the word "stop" is referred to as a state during which an ignition switch is turned off or a power switch operative to drive a motor of the vehicle 100 is turned off. In other words, the word "stop" is referred to as a state during which the vehicle 100 is parked.

The vehicle 100 includes a vehicle position detecting unit 16 for detecting the position of the vehicle 100. The vehicle position detecting unit 16 includes, for example, a GPS (Global Positioning System) sensor that detects a position of the vehicle by a radio navigation based on this sensor. The vehicle position detecting unit 16 may detect a position of the vehicle by a combination of the radio navigation and an autonomous navigation, which calculates a relative position of the vehicle 100 from a speed and a direction of the vehicle 100 and the like.

The vehicle position detecting unit 16 appropriately reads road information 17 from a road information storage unit 18 which stores the road information 17. The road information 17 includes node data related to nodes corresponding to intersections, branching points and the like, link data related to links that are each set between nodes, attribute data relating to the type of road and the like, and facility attribute data related to facilities and particular points. The vehicle position detecting unit 16 refers to the detected vehicle position and the road information 17 to correct the vehicle position.

The vehicle information terminal 11 is an information terminal used in the vehicle 100 and may be an on-board information terminal or a portable information terminal such as a smart phone. The vehicle information terminal 11 includes a power generation information management unit 12 (hereafter referred to as a "management unit"). The management unit 12 includes a computing unit, a storage device and the like, and has a clock function for acquiring time and a timer function for counting. The storage device stores a program for generating the power generation information, a program for transmitting the power generation information to the statistics center 101 via a communication device 15 mounted on the vehicle 100, and the like.

In this embodiment, the power generation monitoring unit 14 of the solar power generating device 13, the vehicle position detecting unit 16, and the vehicle information terminal 11 are connected to each other via a vehicle bus 19 serving as a communication path such as a CAN (Controller Area Network). The management unit 12 receives a unit time power generation amount ΔE outputted from the power generation monitoring unit 14 of the solar power generating device 13. The unit time power generation amount ΔE refers to an amount of electric power generated by the solar power generating device 13 per unit time. The management unit 12 accumulates the unit time power generation amount ΔE in the storage unit with the time at which the power generation amount ΔE has been received. In addition, the management unit 12 receives the vehicle position outputted from the vehicle position detecting unit 16 through the vehicle bus 19.

The statistics center 101 includes an information statistics server 21 having an information statistics unit 20, and an information providing server 22 for providing assistance information, which is generated based on the collected power generation information, to the user.

The information statistics unit 20 of the information statistics server 21 receives the power generation information transmitted from the vehicle information terminal 11 via a center communication device 23. The received power generation information is accumulated in the power generation information storage unit 24.

The information statistics unit 20 includes a computing unit, a storage device and the like. The information statistics unit 20 stores a program for automatically accumulating the received power generation information in the power generation information storage unit 24. The information statistics unit 20 analyzes or takes statistics of the power generation information collected from an unspecified number of vehicles to generate support information related to power generation efficiency depending on driving environments. Here, the word "driving environment" is referred to as not only an environment during travel but also an environment during stop. The assistance information is accumulated in a support information storing unit 25. The support information includes information related to the amount of power generated by the solar power generating device 13 such as an average value of the power generation amount in each region and at each time period, power generation history, and the like.

The information providing server 22 is accessible to the support information storing unit 25. The information providing server 22 includes a support information providing unit 26 and a user information storage unit 27. The user information storage unit 27 stores user information related to the user who receives the support information. The user information includes identification information of the user information terminal 103 such as the portable information terminal or the like owned by the user. On the basis of the identification information of the user information terminal 103, the support information providing unit 26 transmits the support information to the user information terminal 103 via a delivery unit 28. The user information terminal 103 may be a vehicle information terminal 11.

Figure 2:
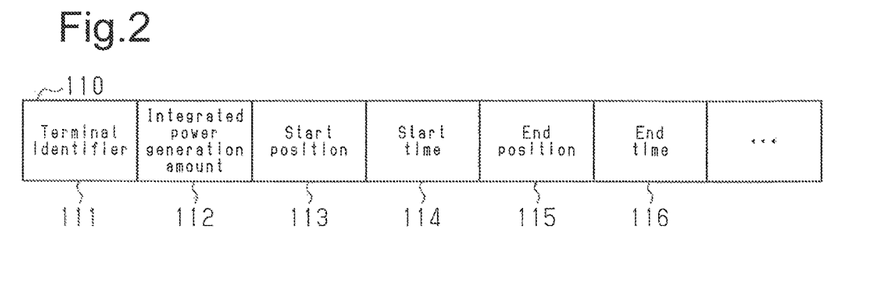
FIG. 2 is a schematic diagram showing an example of data structure of power generation information transmitted from the vehicle information terminal of FIG. 1.

Referring now to FIG. 2, an example of a data structure of the power generation information 110 will be described. The power generation information 110 includes a terminal identifier 111 which is an identifier of the vehicle information terminal 11, and an integrated power generation amount 112 of the solar power generating device 13. The integrated power generation amount 112 is a power generation amount obtained by integrating the unit time power generation amount $\Delta E$ of the solar power generating device 13 in a predetermined distance or time. In addition, the power generation information 110 includes a start position 113 indicating a position of the vehicle 100 at which the integration has been stated, and a start time 114 indicating a time at which the vehicle 100 is located at the start position 113. In addition, the power generation information 110 includes an end position 115 indicating a position at which the integration has been stopped, and an end time 116 indicating a time at which the vehicle 100 is located at the end position 115. The timings of the start and end of the integration of the power generation amount are decided by the management unit 12.

Figure 3:
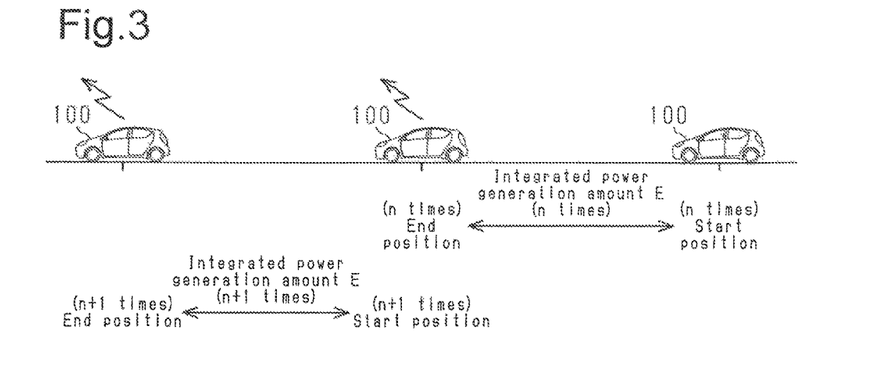
FIG. 3 is a schematic diagram showing a relationship between the power generation information of FIG. 2 and the vehicle position along with an example of changes in position during travel of the vehicle.

Referring to FIG. 3, the relationship between the integrated power generation amount and the vehicle position will be described together with an example of the change during travel of the vehicle 100. The example of FIG. 3 shows the vehicle 100 during travel, namely a state where the vehicle 100 moves. For example, an integrated power generation amount E (n) is defined by an integrated value of the power generation amount of the solar power generating device 13 from when an "n times" integration of the power generation amount has been started until when the "n times" integration has been stopped. The integrated power generation amount E (n) is correlated with the start position 113, the end position 115 and the like of the "n times" integration, and defined as the integrated power generation amount 112 of the power generation information 110. The power generation information 110 is transmitted when the vehicle 100 is located in the vicinity of each end position as shown in FIG. 3.

When the "n times" integration of the power generation amount has been finished, the end position of the "n time" integration is replaced by a start position of an "n+1 times" integration, and the "n+1 times" integration of the power generation amount starts. The "n+1 times" integration of the power generation amount is performed until the vehicle 100 reaches the end position of the "n+1 times" integration. In this way, the integration of the power generation amount is repeated to generate the power generation information 110, and the power generation information 110 is transmitted.

Figure 4:
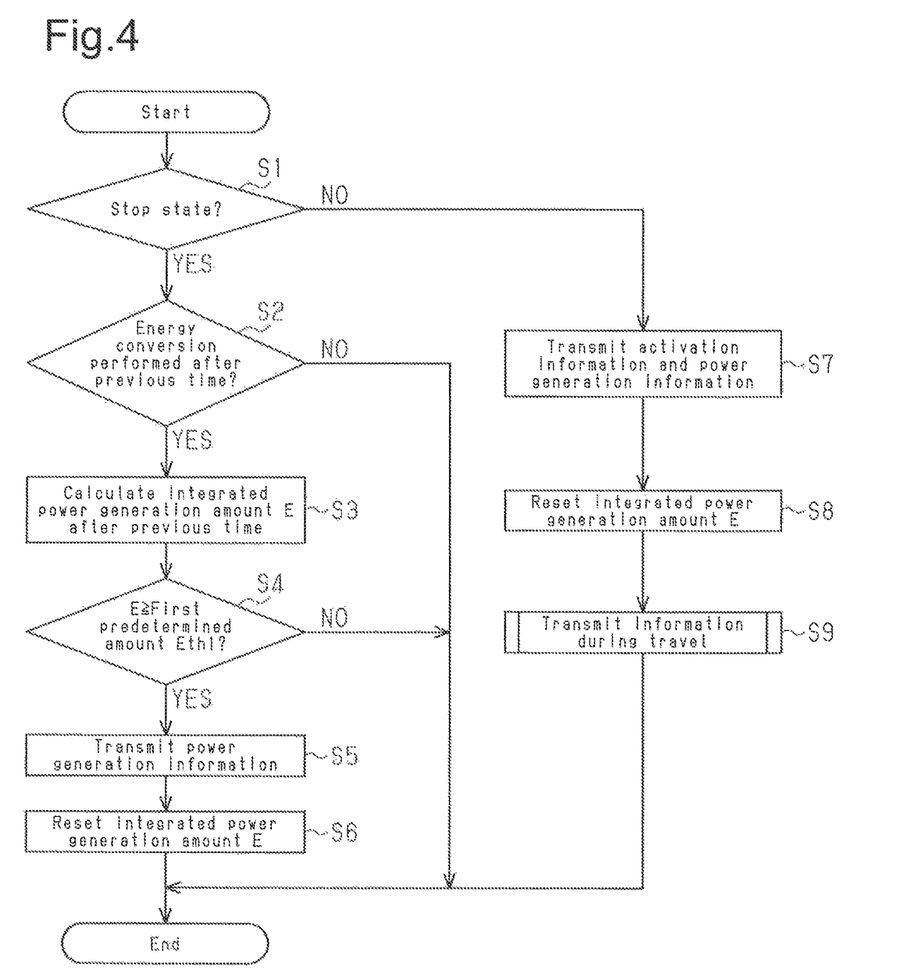
FIG. 4 is a flowchart according to the first embodiment showing the procedure of transmission of the power generation information during a stop of the vehicle.

Referring now to FIG. 4, an operation of the vehicle information terminal 11 of this embodiment will be described together with procedures for transmitting the power generation information. The transmission process of the power generation information is started when a predetermined start condition is satisfied, and repeated at a predetermined cycle. The start condition is, for example, an activation of the vehicle information terminal 11, an activation of the solar power generating device 13, an activation of the program (application) that is for transmitting the power generation information, the fact that the time becomes the transmission start time, or the fact that an amount of sunlight detected by a luminometer (not shown) and the like becomes equal to or more than a predetermined value. The transmission process of the power generation information is stopped when a predetermined stop condition is satisfied. The stop condition is, for example, a termination of the operation of the solar power generating device 13, a termination of the program (application) that is for transmitting the power generation information, the fact that the time becomes the transmission end time, or the fact that an amount of sunlight detected by the luminometer and the like (not shown) is smaller than a predetermined value.

As shown in FIG. 4, when the transmission process of the power generation information 110 has been started, the management unit 12 of the vehicle information terminal 11 determines whether the vehicle 100 is in the stop state (step 31). In this embodiment, the management unit 12 determines whether the power switch is turned on to determine whether the vehicle 100 is in the stop state. In a case that the vehicle 100 includes the ignition switch instead of the power switch, the management unit 12 determines whether the ignition switch is turned on.

For example, when the power switch is turned off and the vehicle 100 is parked, the management unit 12 determines that the vehicle 100 is in the stop state (step S1: YES), and determines whether the energy conversion has been performed by the solar power generating device 13 after the transmission of the power generation information 110 at the previous time (step S2). In this case, the management unit 12 refers, for example, to its own storage unit to determine the presence or absence of information on the unit time power generation amount $\Delta E$ received from the power generation monitoring unit 14 of the solar power generating device 13, in order to determine whether the energy conversion has been performed.

After having determined that the energy conversion is not performed by the solar power generating device 13 (step S2: NO), the management unit 12 terminates the process in the present cycle and executes the step S1 in the next cycle.

Conversely, when the solar power generating device 13 generates electric power when the vehicle 100 is parked, the management unit 12 receives the unit time power generation amount $\Delta E$ from the power generation monitoring unit 14 through the vehicle bus 19, and stores the unit time power generation amount $\Delta E$ in the storage unit. In this case, the management unit 12 determines that the energy conversion has been performed by the solar power generating device 13 (step S2: YES), and calculates the integrated power generation amount E from the previous time integration (step S3). In this case, the management unit 12 integrates the unit time power generation amount $\Delta E$ accumulated in the storage unit to calculate the integrated power generation amount E.

Next, the management unit 12 determines whether the integrated power generation amount E has reached the first predetermined amount Eth1, namely whether the integrated power generation amount E is equal to or more than the first predetermined amount Eth1 (step S4). The first predetermined amount Eth1 is set to a value enough to reserve minimum benefit of the power generation information 110.

When the management unit 12 determines that the integrated power generation amount E has reached the first predetermined amount Eth1 (step S4: YES), the management unit 12 generates and transmits the power generation information 110 (step S5). During stop of the vehicle 100, the start position 113 and the end position 115 are the same. In addition, the start time 114 is the time at which the management unit 12 has received a first one of the unit time power generation amount $\Delta E$ accumulated in the storage unit. The end time 116 is the time at which the management unit 12 has received a last one of the unit time power generation amount ΔE. The integrated power generation amount 112 is the integrated power generation amount E calculated at step S3.

After the power generation information 110 has been transmitted, the management unit 12 resets the integrated power generation amount E stored in its own storage unit to "0" (step S6). At this time, the management unit 12 excludes the unit time power generation amount ΔE, which has been used for the calculation of the integrated power generation amount E, from the objects to be integrated at a next time. After the integrated power generation amount E has been reset, the management unit 12 terminates the process in the present cycle, and executes step S1 in the next cycle.

Conversely, if it is determined at step S4 that the integrated power generation amount E has not reached the first predetermined amount Eth1 (step S4: NO), the management unit 12 terminates the process in this cycle without the transmission of the power generation information 110, and executes the step S1 in the next cycle. At this time, the integrated power generation amount E is not reset and is continuously used in the next cycle.

As discussed above, when the vehicle 100 is in the stop state, for example, when the vehicle 100 is parked in a parking lot, the steps S1 to S6 are repeatedly executed, and the power generation information 110 is transmitted from the vehicle information terminal 11 only at the timing when the integrated power generation amount E has reached the first predetermined amount Eth1. Therefore, by increasing the first predetermined amount Eth1 to a value enough to reserve the benefit of the power generation information 110, the transmission frequency of the power generation information 110 from the vehicle information terminal 11 is suppressed as much as possible, while minimum power generation information 110 is collected in the information statistics unit 20.

Conversely, for example, when the power switch or the like is turned on, and it is determined at step S1 that the state of the vehicle 100 is not in the stop state (step S1: NO), the management unit 12 transmits an activation information, which indicates that the vehicle 100 has been activated, and the power generation information 110 (step S7). The power generation information 110 transmitted at this time includes a new integrated power generation amount 12 after the integrated power generation amount E has been reset at step 6 as described above. When the power generation information 110 has been transmitted after the power switch or the like is turned on as discussed above, the management unit 12 resets the integrated power generation amount E (step S8), and performs the transmission process of the power generation information during travel (step S9).

Figure 5:
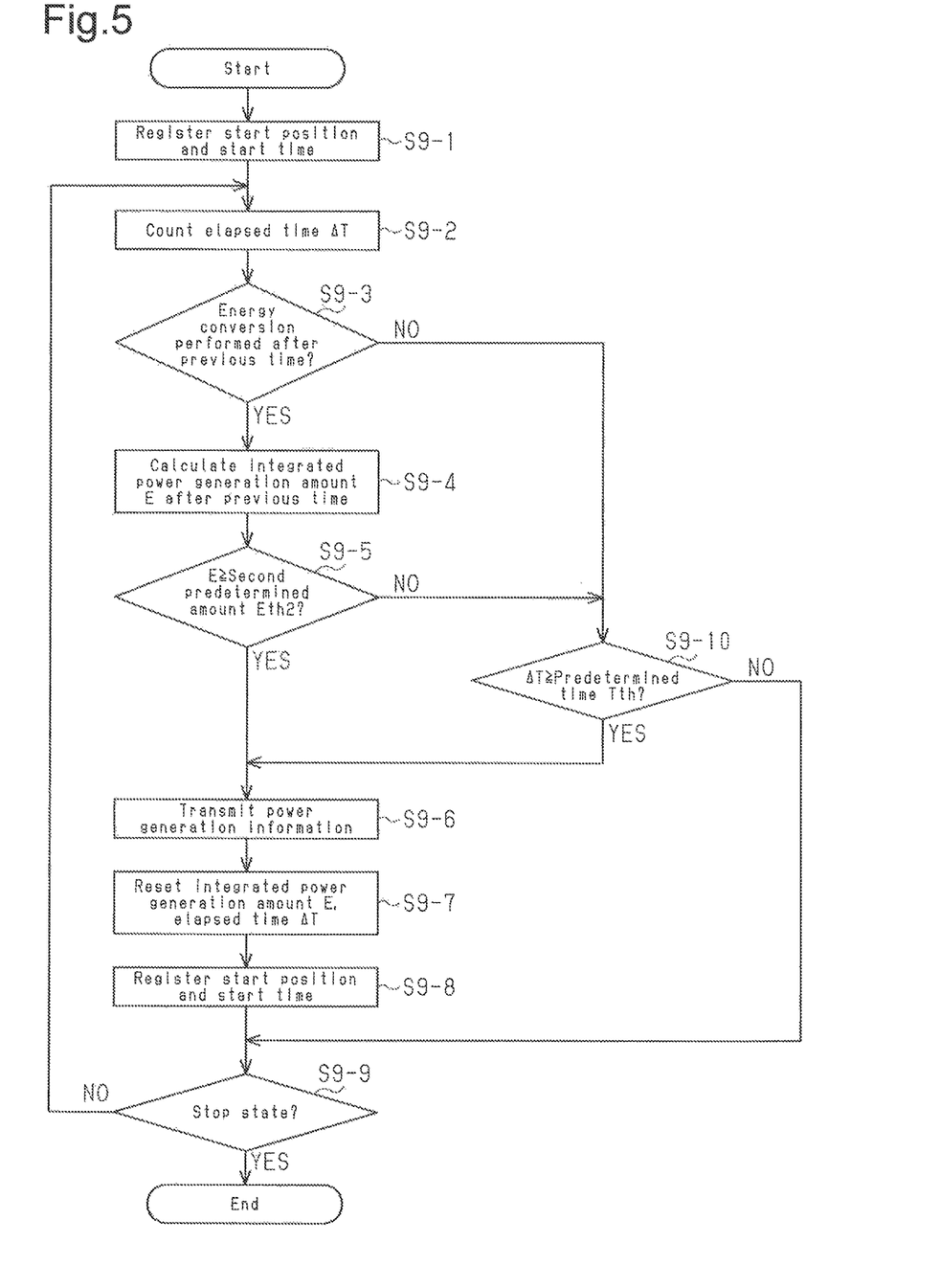
FIG. 5 is a flowchart according to the first embodiment showing the procedure of transmission of the power generation information during travel of the vehicle.

Next, referring now to FIG. 5, a process for transmitting the power generation information during travel will be described. In this embodiment the word "during travel" is referred to as when the power switch is turned on.

The management unit 12 of the vehicle information terminal 11 first acquires the position and time of the vehicle 100 at this time and registers it in the storage unit as the start position and the start time at which the integration of the power generation amount starts (step S9-1). The management unit 12 starts to measure an elapsed time ΔT (step S9-2). In a similar manner as step S2, the management unit 12 determines whether the energy conversion has been performed by the solar power generating device 13 after the power generation information 110 has been transmitted at the previous time (step S9-3).

When it is determined that the energy conversion has been performed by the solar power generating device 13 (step S9-3: YES), the management unit 12 calculates the integrated power generation amount E from the previous time (step S9-4) in a similar manner as step S3. In addition, the management unit 12 determines whether the calculated integrated power generation amount E has reached a second predetermined amount Eth2, that is, whether the integrated power generation amount E is equal to or more than the second predetermined amount Eth2 (step S9-5). The second predetermined amount Eth2 is set to be smaller than the first predetermined amount Eth1 discussed above so as to increase the frequency of transmission of the power generation information 110 during travel with respect to the frequency during stop of the vehicle 100.

After having determined that the integrated power generation amount E is equal to or more than the second predetermined amount Eth2 (step S9-5: YES), the management unit 12 generates and transmits power generation information 110 to the statistics center 101 (step S9-6). In this case, the management unit 12 acquires the position and time of the vehicle 100 at the present time, and stores it in the memory unit as an end position and end time. The management unit 12 generates the power generation information 110 using the start position and start time, the end position and end time, and the integrated power generation amount E calculated at step S9-4 that has been stored in the storage unit.

After having transmitted the power generation information 110, the management unit 12 resets the integrated power generation amount ΔE and the elapsed time ΔT (step S9-7). At this time, the unit time power generation amount ΔE used for the calculation of the integrated power generation amount E is also excluded from the object to be integrated. In addition, the management unit 12 registers a new start position and start time (step S9-8). That is, the management unit 12 overwrites the end position and end time, which have been included in the power generation information 110, as the new start position and start time.

After having stored the start position and start time, the management unit 12 determines whether the vehicle 100 is in the stop state (step S9-9). When the travelling state is continued (step S9-9: NO), the management unit 12 returns to step S9-2 and newly starts to measure the elapsed time ΔT. The measurement of the elapsed time ΔT after transmission may be performed after the elapsed time ΔT is reset (step S9-7).

At step S9-5, when it is determined that the integrated power generation amount E is less than the second predetermined amount Eth2 (step S9-5: NO), the management unit 12 determines whether the elapsed time ΔT has reached the predetermined time Tth, namely whether the elapsed time ΔT is equal to or more than the predetermined time Tth (step S9-10). The determination as to whether the elapsed time ΔT has reached the predetermined time Tth is performed because the statistics center 101 requires, even if the weather is cloudy or rainy so that the integrated power generation amount E is small, the power generation information 110 indicating that the integrated power generation amount E is small. During travel during which the position of the vehicle 100 changes, it is desirable to increase the transmission frequency as compared to when the vehicle is stopped.

After having been determined that the elapsed time ΔT is equal to or more than the predetermined time Tth (step S9-10: YES), the management unit 12 generates and transmits the power generation information 110 (step S9-6).

Here, the management unit 12 integrates the unit time power generation amount ΔE stored in the storage unit, sets the position and time of the vehicle 100 at the present time as the end position and end time, and generates the power generation information. Conversely, when the elapsed time ΔT has not reached the predetermined time Tth (step S9-10: NO), the management unit 12 proceeds to step S9-9 and determines whether the vehicle 100 is in the stopped state. After having been determined that the vehicle 100 is not in the stopped state (step S9-9: NO), the management unit 12 returns to step S9-2, and continues to measure the elapsed time ΔT.

Then, when the vehicle 100 arrives at the designated location and the power switch or the like is turned off (step S9-9: YES), the management unit 12 returns to step S1 shown in FIG. 4 and performs the process of transmitting the power generation information during stop of the vehicle 100. Even when the power switch or the like is turned off, an activated state of the vehicle information terminal 11 is maintained.

As discussed above, during travel of the vehicle 100, the power generation information 110 is transmitted to the statistics center 101 when the integrated power generation amount E has reached the second predetermined amount Eth2, which is smaller than the first predetermined amount Eth1, or when the elapsed time T has reached a predetermined time Tth. Therefore, the frequency of transmitting the power generation information 110 during travel of the vehicle 100 is greater than the frequency of the transmission during stop of the vehicle 100, during which the power generation information is transmitted when the power generation amount E has reached the first predetermined amount Eth1, when a comparison is performed under a condition in which an amount of the power generation is the same between during travel and during stop. The statistics center 101 collects a number of power generation information 110 including start positions that differ from each other and end positions that differs from each other. Thus, the statistics center 101 collects a number of data necessary for the statistics regarding the power generation efficiency, for example, at each area or each particular point, and generates support information to be provided to the user. The reliability of the support information is also enhanced.

In addition, during stop of the vehicle 100, the power generation information is transmitted at a timing when the integrated power generation amount E has reached the first predetermined amount Eth1. Thus, the transmission frequency becomes minimum. For example, even in the same stop state, the transmission frequency is reduced in the case of cloudy or rainy weather, and is increased in the case of fine weather. Thus, for example, if the power generation amount of the solar power generating device 13 is small, it is possible to reduce power consumption by the transmission process and to reduce the load of the vehicle information terminal 11. Moreover, even if the transmission frequency is reduced, the statistics center 101 obtains the power generation amount from the power generation information at each predetermined time since the power generation information includes the integrated power generation amount and the time associated therewith.

As described above, this embodiment has the following advantages.

(1) During travel of the vehicle 100 during which the change in the position of the vehicle 100 is large, the power generation information is transmitted from the vehicle information terminal 11 at intervals shorter than that during stop of the vehicle 100. Therefore, during travel, the statistics center 101 obtains much more information regarding the integrated power generation amount E associated with the vehicle position. Conversely, during stop of the vehicle 100, it is possible to suppress the increase in the load and power consumption of the vehicle information terminal 11. Therefore, the statistics center 101 efficiently collects the power generation information in a preferred manner considering the travel condition of the vehicle 100.

(2) Even during stop of the vehicle 100, the power generation information is transmitted from the vehicle information terminal 11 when the integrated power generation amount E becomes equal to or more than the first predetermined amount Eth1. Therefore, it is possible to reduce the transmission frequency of the power generation information from the vehicle information terminal 11 while the statistics center 101 and the like collects the minimum power generation information.

(3) During travel of the vehicle 100, the power generation information is transmitted when the integrated power generation amount E has reached the second predetermined amount Eth2, which is smaller than the first predetermined amount Eth1. Thus, at least in a state in which the solar power generating device 13 generates electric power, the power generation information is transmitted at shorter intervals during travel of the vehicle 100 than during stop of the vehicle 100 under the condition in which an amount of the power generation is the same. Accordingly, a lot of information regarding the integrated power generation amount E associated with the vehicle position is obtained.

(4) During travel of the vehicle 100, the power generation information is transmitted when the elapsed time ΔT has reached the predetermined time Tth. That is, even when the vehicle 100 is in a travel environment that lowers the power generation efficiency, the power generation information is transmitted. Therefore, the statistics center 101 obtains a lot of information regarding the integrated power generation amount E associated with the vehicle position depending on the setting of the predetermined time Tth.

(Second Embodiment)

Next, a second embodiment of a vehicle information terminal and a power generation information collection system will be described mainly with respect to differences from the first embodiment, with reference to FIG. 6. The vehicle information terminal and the power generation information collection system according to the present embodiment have a basic structure that is the same as the first embodiment. Duplicated description thereof will be omitted.

In this embodiment, the procedure of the transmission of the power generation information 110 during travel of the vehicle 100 is the same as the first embodiment. Only the procedure of the transmission of the power generation information 110 during stop of the vehicle 100 is different from the first embodiment.

Figure 6:
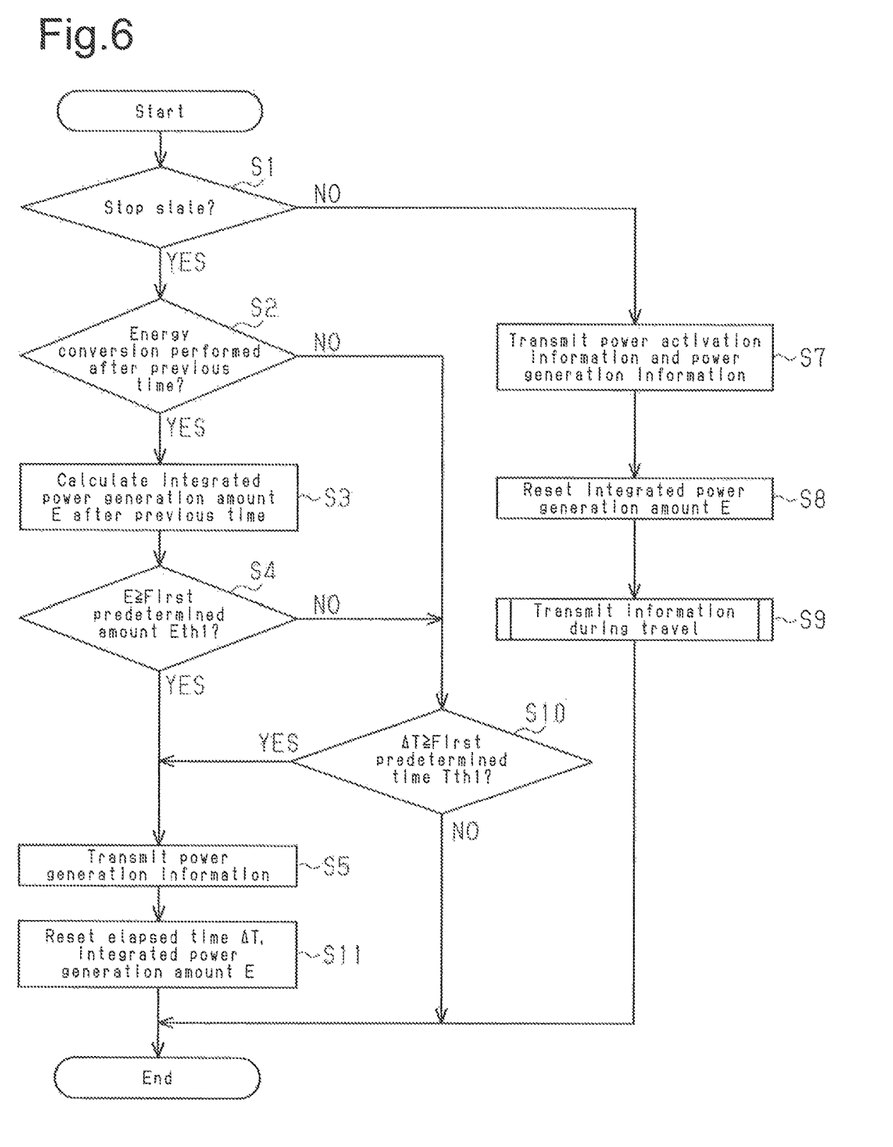
FIG. 6 is a flowchart according to a second embodiment showing the procedure of transmission of the power generation information during a stop of vehicle.

Referring to FIG. 6, the operation of the vehicle information terminal 11 of this embodiment will be described together with the procedure of the transmission of the power generation information. In the second embodiment, transmission of the power generation information during stop of the vehicle is performed when the integrated power generation amount E has reached the first predetermined amount Eth1, or when the elapsed time ΔT has reached a first predetermined time Tth1. In the second embodiment, a second predetermined time Tth2 serves as the predetermined time Tth used for the transmission of the power generation information 110 during travel of the vehicle 100. The first predetermined time Tth1 is set to be longer than the second predetermined time Tth2.

In the present embodiment, After having determined that the vehicle 100 is in the stopped state at step S1, the management unit 12 starts to measure the elapsed time ΔT and determines whether the energy conversion has been performed by the solar power generating device 13 (step S2). After having determined that the solar power generating device 13 did not perform the energy conversion (step S2: NO), the management unit 12 determines whether the elapsed time ΔT has reached the first predetermined time Tth1, namely whether the elapsed time ΔT is equal to or more than the first predetermined time Tth1 (step S10). The start of the measurement of the elapsed time ΔT may be performed after the determination that the solar power generating device 13 did not perform the energy conversion (step S2 NO).

After having determined that the elapsed time ΔT is equal to or more than the first predetermined time Tth1 (step S10: YES), the management unit 12 generates and transmits the power generation information to the statistics center 101 (step S5). Then, the management unit 12 resets the elapsed time ΔT and the integrated power generation amount E (step S11), and terminates the process in the present cycle. The management unit. 12 executes the step S1 in the next cycle. In this embodiment, the management unit 12 resets the elapsed time ΔT, and then starts to measure the elapsed time ΔT.

Conversely, after having determined that the elapsed time ΔT is less than the first predetermined time Tth1 (step S10: NO), the management unit 12 does not transmit the power generation information 110, terminates the process in this cycle, and executes the step S1 in the next cycle. At this time, the integrated power generation amount E and the elapsed time ΔT are not reset and are continuously used in the next cycle.

In addition, after having determined at step S4 that the integrated power generation amount E is less than the first predetermined amount Eth1 (step S4: NO), the management unit 12 determines whether the elapsed time ΔT is equal to or more than the first predetermined time Tth1 (step S10). After having determined that the elapsed time ΔT is equal to or more than the first predetermined time Tth1 (step S10: YES), the management unit 12 transmits the power generation information (step S5).

Thus, in this embodiment, both the first predetermined amount Eth1, which is a threshold of the integrated power generation amount E, and the first predetermined time Tth1, which is a threshold of the elapsed time ΔT that are used during stop of the vehicle 100 are respectively greater than the second predetermined amount Eth2 and the second predetermined time Tth2 that are used during travel of the vehicle 100. Therefore, the frequency of transmitting the power generation information 110 during stop of the vehicle 100 is smaller than the frequency of transmitting during travel of the vehicle 100, when a comparison is performed under the condition that the power generation amount is the same. In addition, at the time during stop of the vehicle 100 and when the solar power generating device 13 does not generate electric power, the statistics center 101 collects the power generation information 110 indicating "no power generation". Therefore, the statistics center 101 determines at every first predetermined time Tth1 that the vehicle 100, which has transmitted the power generation information 110 indicating "no power generation", is in the travelling environment, in which the power generation efficiency is low.

As described above, this embodiment has the following advantage in addition to the above advantages (1) to (4).

(5) During stop of the vehicle 100, the management unit 12 transmits the power generation information when the integrated power generation amount E has reached the first predetermined amount Eth1, or when the elapsed time ΔT has reached the first predetermined time Tth1. Therefore, it is possible to suppress the increase in the load and power consumption of the vehicle information terminal 11. Moreover, during stop of the vehicle 100 and when the vehicle 100 is in the driving environment in which the power generation efficiency is low, the power statistics center 101 collects the power generation information indicating that the power generation efficiency is low.

(Third Embodiment)

Next, a third embodiment of a vehicle information terminal and a power generation information collection system will be described mainly with respect to differences from the first embodiment, with reference to FIGS. 7 and 8. The vehicle information terminal and the power generation information collection system according to the present embodiment have a basic structure that is the same as the first embodiment. Duplicated description thereof will be omitted.

In the present embodiment, the statistics center 101 determines the state of the vehicle 100 in which the vehicle information terminal 11 is used, based on the power generation information 110 transmitted from the vehicle information terminal 11. The statistics center 101 determines whether the statistics center 101 specifies the transmission interval of the power generation information 110 to the vehicle information terminal 11 based on the state of the vehicle 100. According to the instructions from the statistics center 101, the vehicle information terminal 11 transmits the power generation information 110 to the statistics center 101.

Figure 7:
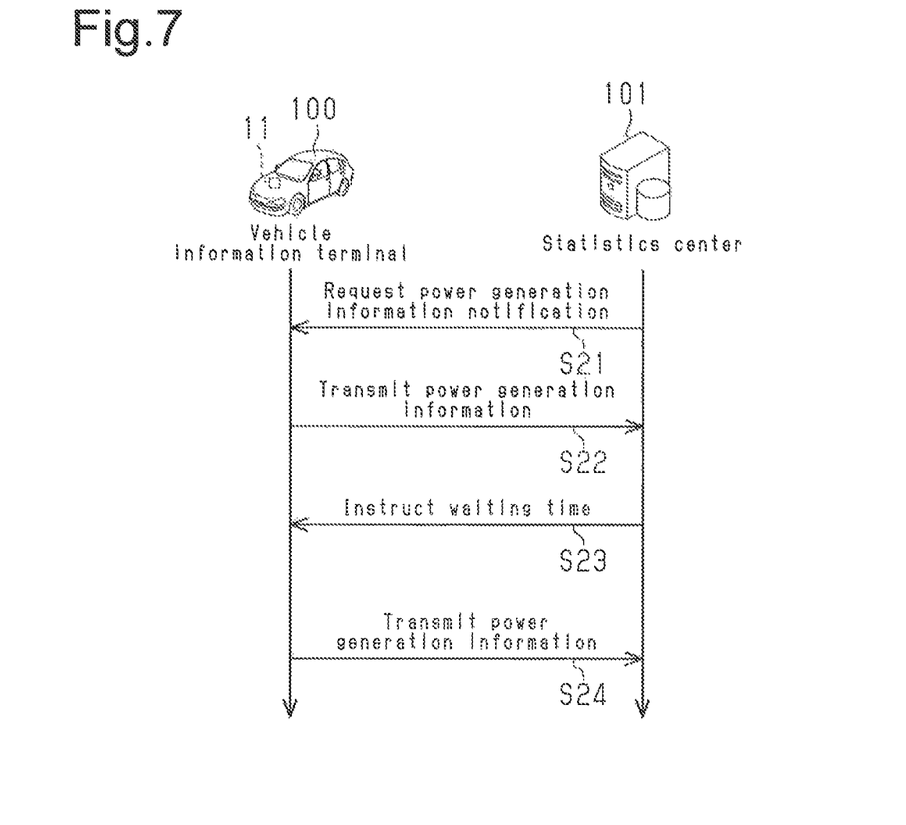
FIG. 7 is a sequence diagram according to a third embodiment showing a procedure for collecting the power generation information.

Referring to FIG. 7, the operation of the vehicle information terminal 11 and the statistics center 101 of the present embodiment will be described. An example shown in FIG. 7 indicates a manner of the transmission and reception of data when the statistics center 101 has specified the transmission interval of the power generation information 110. At first, the information statistics unit 20 of the statistics center 101 transmits a notification request for the power generation information to the vehicle information terminal 11 (step S21). The vehicle information terminal 11 transmits the power generation information 110 to respond to the notification request (step S22).

Based on the received power generation information 110, the information statistics unit 20 determines whether the vehicle information terminal 11, which has transmitted the power generation information 110, should continue to transmit the power generation information 110. When the information statistics unit 20 has determined that the vehicle information terminal 11 should continue to transmit the power generation information 110, the information statistics unit 20 determines that the vehicle is in the stop state or in the travel state. The information statistics unit 20 decides, based on the state of the vehicle 100, a waiting time Tw during which the transmission of the power generation information 110 waits to occur, and transmits the instruction of the waiting time Tw (step S23). This waiting time Tw may be decided based on, not only the state of the vehicle 100 such as stop and travel, but also the state including the integrated power generation amount E and the time contained in the power generation information 110. For example, the waiting time Tw may be set to be longer when the vehicle 100 is stopping, and the waiting time Tw may be set to be shorter when the vehicle 100 is traveling. In addition, the waiting time Tw may be set to be shorter when the integrated power generation amount E is large, and the waiting time Tw may be set to be longer when the integrated power generation amount E is small.

After having received an instruction indicating the waiting time Tw, the vehicle information terminal 11 uses a timer of its own and stops transmission of the power generation information 110 until the waiting time Tw has elapsed. Then, when the waiting time Tw has elapsed, the vehicle information terminal 11 transmits the power generation information 110 to the statistics center 101 (step S24).

Figure 8:
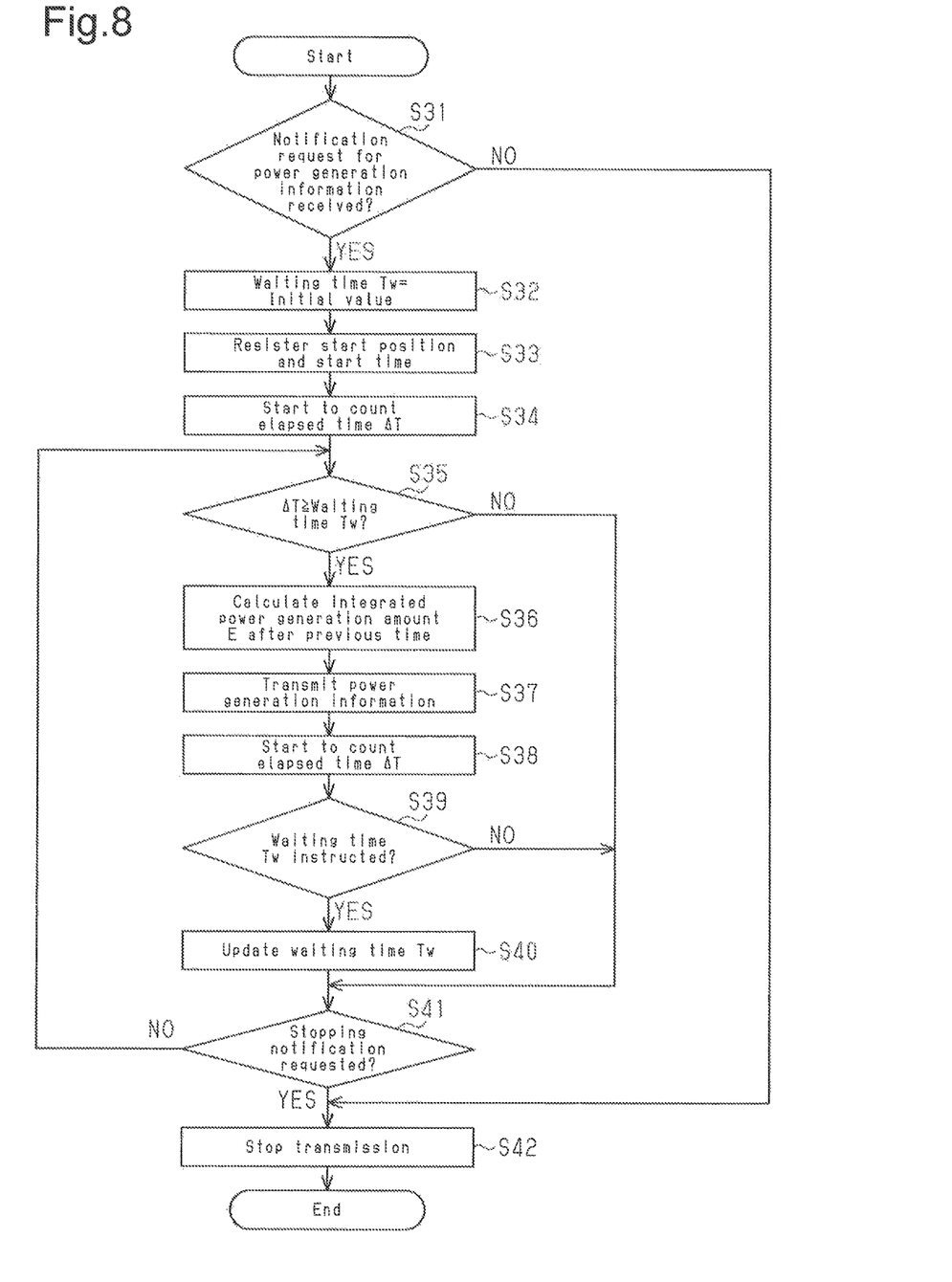
FIG. 8 is a flowchart according to the third embodiment showing the procedure of transmission of the power generation information from the vehicle information terminal.

Referring now to FIG. 8, the operation of the vehicle information terminal 11 of this embodiment will be described together with procedures of the transmission process of the power generation information. This process is repeated at a predetermined cycle.

As shown in FIG. 8, the management unit 12 of the vehicle information terminal. 11 determines whether the management unit 12 has received the notification request for the power generation information 110 (step S31). When the management unit 12 has not received the notification request for the power generation information 110 (step S31: NO), the management unit 12 stops transmission of the power generation information 110 (step S42).

When the management unit 12 has received the notification request for the power generation information 110 (step S31: YES), the management unit 12 sets a waiting time Tw for waiting for the transmission of the power generation information to an initial value (step S32). The management unit 12 registers in the storage unit a start position and a start time at which the integration of the power generation starts (step S33). In addition, the management unit 12 starts to count the elapsed time ΔT by the above timer (step S34).

The management unit 12 determines whether the elapsed time ΔT has reached the waiting time Tw, namely whether the elapsed time ΔT is equal to or more than the waiting time Tw (step S35). When the elapsed time ΔT has not reached the waiting time Tw (Step S35: NO), the management unit 12 determines whether the management unit 12 has received a request for stopping notification from the statistics center 101 (step S41). The request for stopping notification is transmitted from the statistics center 101 when the collection of power generation information 110 is not required, for example, at night, when requested by the user, or the like.

When having determined that the management unit 12 does not receive the request for stopping notification (Step S41: NO), the management unit 12 returns to step S35, and repeats the determination as to whether the elapsed time ΔT has reached the waiting time Tw. Then, when having determined that the elapsed time ΔT reaches the waiting time Tw (step S35: YES), the management unit 12 integrates a unit time power generation amount ΔE after the reception of the notification request from the statistics center 101, and calculates the integrated power generation amount E (step S36). The management unit 12 stores, in the memory unit, the position and time of the vehicle 100 at the present time as the end position and end time. The management unit 12 generates the power generation information using the start position and start time, the end position and end time, and the integrated power generation amount E that are stored in the storage unit and transmits the power generation information to the statistics center 101 (step S37). After having transmitted the power generation information, the management unit 12 newly starts a count of the elapsed time ΔT by using the timer (step S38).

The statistics center 101 determines change or maintenance of the waiting time Tw based on the power generation information 110, which has been received by the statistics center 101.

The management unit 12 determines whether it has received an instruction indicating the waiting time Tw from the statistics center 101 (step S39). When the waiting time Tw has been instructed (step S39: YES), the management unit 12 updates the waiting time Tw, which has been set in its own storage unit, to the indicated time (step S40), and proceeds to step S41. When the waiting time Tw has not been instructed (step S39: NO), the management unit 12 proceeds to step S41 while maintaining the waiting time Tw to the initial value.

When having determined that the management unit 12 received the request for stopping notification at step S41 (step S41: YES), the management unit 12 stops the transmission of the power generation information 110 (step S42), and repeats the above-described process from step S31.

Thus, since the statistics center 101 can specify the waiting time Tw, it is possible to specify the waiting time Tw according to conditions other than the stopped state or the travel state. For example, it is possible to increase the transmission frequency at an area or time period at which a data amount is insufficient, and reduce the transmission frequency at an area or time period at which a sufficient amount of data is obtained.

As described above, this embodiment has following advantage in addition to the above advantage (1).

(6) When the vehicle information terminal 11 has received a specified waiting time from the statistics center 101, the vehicle information terminal 11 transmits the power generation information at a timing when the elapsed time ΔT from the transmission of the power generation information at the previous time reaches the specified waiting time Tw. Therefore, the statistics center 101 can relatively and freely change the transmission frequency of the power generation information.

(Other Embodiments)

Each of the above embodiments can also be implemented with a manner as follows.

During stop, the power generation information may be transmitted only when the integrated power generation amount E has reached the first predetermined amount Eth1, and during travel, the power generation information may be transmitted only when the elapsed time ΔT has reached the predetermined time Tth. Also in this case, the transmission frequency of the power generation information is reduced during stop to reduce the load and power consumption in the vehicle information terminal 11, and during travel, the statistics center 101 collects a lot of data of the power generation amount associated with the position of the vehicle 100, which varies according to the travelling.

During stop, the power generation information may be transmitted only when the integrated power generation amount E has reached the first predetermined amount Eth1, and during travel, the power generation information may be transmitted only when the integrated power generation amount E has reached the second predetermined amount Eth2 (<first predetermined amount Eth1). Also in this case, the transmission frequency of the power generation information is reduced during stop to reduce the load and power consumption in the vehicle information terminal 11, and during travel, the statistics center 101 collects a lot of data of the power generation amount associated with the position of the vehicle 100, which varies according to the travelling.

During stop, the power generation information may be transmitted only when the elapsed time ΔT has reached the first predetermined time Tth1, and during travel, the power generation information may be transmitted only when the elapsed time ΔT has reached the second predetermined time Tth2 (< first predetermined time Tth1). Also in this case, the transmission frequency of the power generation information is reduced during stop to reduce the load and power consumption in the vehicle information terminal 11, and during travel, the statistics center 101 collects a lot of data of the power generation amount associated with the position of the vehicle 100, which varies according to the travelling.

During stop, the power generation information may be transmitted when the integrated power generation amount E has reached the first predetermined amount Eth1 or when the elapsed time ΔT has reached the first predetermined time Tth1, and during travel, the power generation information may be transmitted only when the elapsed time ΔT has reached the second predetermined time Tth2 (< first predetermined time Tth1). Also in this case, depending on the setting of the first predetermined time Tth1, the second predetermined time Tth2, and the first predetermined amount Eth1, the transmission frequency of the power generation information is reduced during stop to reduce the load and power consumption in the vehicle information terminal 11, and during travel, the statistics center 101 collects a lot of data of the power generation amount associated with the position of the vehicle 100, which varies according to the travelling.

During stop, the power generation information may be transmitted only when the elapsed time ΔT has reached the first predetermined time Tth1, and during travel, the power generation information may be transmitted when the integrated power generation amount E has reached the second predetermined amount Eth2 or when the elapsed time ΔT has reached the second predetermined time Tth2 (< first predetermined time Tth1) Also in this case, depending on the setting of the first predetermined time Tth1, the second predetermined amount Eth2, and the second predetermined time Tth2, the transmission frequency of the power generation information is reduced during stop to reduce the load and power consumption in the vehicle information terminal 11, and during travel, the statistics center 101 collects a lot of data of the power generation amount associated with the position of the vehicle 100, which varies according to the travelling.

In the above embodiment, the vehicle information terminal 11 receives the unit time power generation amount ΔE from the power generation monitoring unit 14 of the solar power generating devices 13, and integrates the power generation amount ΔE to calculate the integrated power generation amount E. However, the power generation monitoring unit 14 may calculate the integrated power generation amount E and output the integrated power generation amount E upon request from the vehicle information terminal 11.

In the above configuration, the vehicle information terminal 11 transmits the power generation information 110 including the integrated power generation amount E. However, the vehicle information terminal 11 may transmit power generation information that includes a plurality of power generation amounts ΔE per unit time obtained between the start position and end position. Then, the statistics center 101 may calculate the integrated power generation amount E.

In the first embodiment and the second embodiment, the management unit 12 transmits the power generation information at the timing when the elapsed time ΔT has reached the first predetermined time Tth1 or the second predetermined time Tth2. Other than this, the management unit 12 may transmit the power generation information at a timing when a traveled distance from when the power generation information has been transmitted at previous time has reached a predetermined distance.

In the third embodiment, the statistics center 101 specifies the waiting time Tw to the vehicle information terminal 11. Other than this, the statistics center 101 may specify a travel distance for waiting for transmission of the power generation information. Accordingly, for example, the vehicle information terminal 11 may transmit the power generation information at a timing when the vehicle 100 has traveled for the predetermined travel distance. Even in this case, the transmission frequency of the power generation information is reduced while the statistics center 101 efficiently collects the power generation information during travel.

In each of the above embodiments, the stop state is defined as when the power switch or the like is turned off. However, the stop state may be defined as when the travel distance of the vehicle is short, or when the vehicle 100 is in another state indicating that the vehicle does not travel. For example, the management unit 12 may determine that the vehicle 100 is in the stop state when the vehicle 100 is stopped, when the vehicle speed is a predetermined speed (e.g., equal to or less than 10 km per hour), when the shift position may be located at a parking position, or the like. The vehicle speed can be detected by a vehicle speed sensor or the like. The shift position can be obtained from an ECU operative to drive an engine or a driving motor, or from a shift position sensor.

In the above embodiment, the management unit 12 may transmit information regarding the link and the node such as a link ID, a node ID and the like, as the position of the vehicle 100.

In the above embodiment, the statistics center 101 collects the power generation information. A collecting device may be mounted on the vehicle 100 to collect the power generation information. For example, the collection device may perform statistics or analysis of the collected power generation information, and provide support information indicating the power generation history of the vehicle 100 to a user. Even in this case, the transmission frequency of the power generation information is reduced during stop, while during travel, the transmission frequency of the power generation information is increased.

The information statistics server 21 and the information providing server 22 may be a single device, or may be configured by a plurality of devices.

The vehicle information terminal 11 may include at least one of the communication device 15 and the vehicle position detecting unit 16.

The vehicle information terminal 11 may transmit the power generation information through a network other than the vehicle bus 19, namely though a wireless communication or the like.

In the above embodiments, the energy conversion device is embodied by the solar power generating device 13 that performs photoelectric conversion. The energy conversion device may be another device as long as the device is capable of converting external energy to electric power. For example, the energy conversion device may be a device for converting wind power to electric power, a device for converting vibrations of the vehicle 100 to electric power, a device for converting thermal energy outside or inside the vehicle to electric power, a device for converting energy obtained by chemical changes in the molecules in the atmosphere to electric power, or the like. Even in these cases, the transmission frequency of the power generation information is reduced during stop, while during travel, the transmission frequency of the power generation information is increased.

The invention claimed is:

1. A vehicle information terminal used in a vehicle equipped with an energy converter for performing an energy conversion for converting an external energy to an electric power, the vehicle information terminal comprising:
a computing unit that generates a power generation information associated with a vehicle position and a power generation amount of the energy converter, the computing unit operative to transmit the power generation information to an external device, wherein
a transmission condition of the power generation information of the computing unit is set so that transmission frequency of the power generation information during travel of the vehicle is higher than transmission frequency of the power generation information during stop of the vehicle,
the computing unit integrates the power generation amount after the transmission of the power generation information at a previous time,
during stop of the vehicle, the computing unit transmits the power generation information when the integrated power generation amount is more than or equal to a first predetermined amount,
during the travel of the vehicle, the computing unit determines whether the energy conversion has been performed after the power generation information has been transmitted at the previous time,
during the travel of the vehicle, when it is determined that the energy conversion has been performed after the power generation information has been transmitted at the previous time, the computing unit transmits the power generation information when the integrated power generation amount has reached a second predetermined amount, which is smaller than the first predetermined amount, and
during the travel of the vehicle, when it is determined that the energy conversion has not been performed after the power generation information has been transmitted at the previous time, the computing unit transmits the power generation information based on an elapsed time or a travelled distance after the transmission of the power generation information at the previous time.

2. The vehicle information terminal according to claim 1, wherein
during the travel of the vehicle, when it is determined that the energy conversion has not been performed after the power generation information has been transmitted at the previous time, the computing unit transmits the power generation information when the elapsed time or the travelled distance has reached a predetermined time or a predetermined distance after the transmission of the power generation information at the previous time.

3. The vehicle information terminal according to claim 2, wherein:
the predetermined time is a second predetermined time, and
during stop of the vehicle, the computing unit transmits the power generation information when the elapsed time has reached a first predetermined time, which is longer than the second predetermined time.

4. A power generation information collection system comprising:
a vehicle information terminal used in a vehicle equipped with an energy converter for performing an energy conversion for converting an external energy to an electric power; and
an external device for collecting a power generation information transmitted from the vehicle information terminal, wherein:
the vehicle information terminal includes a computing unit that generates the power generation information associated with a vehicle position and a power generation amount of the energy converter, the computing unit operative to transmit the power generation information to the external device,
a transmission condition of the power generation information of the computing unit is set so that transmission frequency of the power generation information during travel of the vehicle is higher than transmission frequency of the power generation information during stop of the vehicle,
the computing unit integrates the power generation amount after the transmission of the power generation information at a previous time,
during stop of the vehicle, the computing unit transmits the power generation information when the integrated power generation amount is more than or equal to a first predetermined amount,
during the travel of the vehicle, the computing unit determines whether the energy conversion has been performed after the power generation information has been transmitted at the previous time,
during the travel of the vehicle, when it is determined that the energy conversion has been performed after the power generation information has been transmitted at the previous time, the computing unit transmits the power generation information when the integrated power generation amount has reached a second predetermined amount, which is smaller than the first predetermined amount,
during the travel of the vehicle, when it is determined that the energy conversion has not been performed after the power generation information has been transmitted at the previous time, the computing unit transmits the power generation information based on an elapsed time or a travelled distance after the transmission of the power generation information at the previous time, and
the external device includes a storage unit that stores the power generation information transmitted from the vehicle information terminal.

5. The power generation information collection system according to claim 4, wherein:
the external device is operative to set a waiting time or a waiting distance in accordance with a state of the vehicle, the transmission of the power generation information being waited during the waiting time and during the waiting distance, the external device is operative to transmit a waiting information indicating the waiting time or the waiting distance, and the computing unit is operative when the computing unit has received the waiting information to transmit the power generation information when a time or a travelled distance after the transmission of the power generation information at a previous time has reached a predetermined time or a predetermined distance that is based on the waiting information.

* * * * *